July 2, 1968 J. I. YELLOTT 3,390,576

SOLAR RADIATION MEASURING DEVICE

Filed Sept. 28, 1965 2 Sheets-Sheet 1

INVENTOR
John I. Yellott

BY [signature]

ATTORNEY

SOLAR RADIATION MEASURING DEVICE

Filed Sept. 23, 1965 2 Sheets-Sheet 2

INVENTOR
John I. Yellott
BY [signature]
ATTORNEY 3,390,576

SOLAR RADIATION MEASURING DEVICE

John I. Yellott, 9051 N. 7th Ave., Phoenix, Ariz. 85021

Filed Sept. 28, 1965, Ser. No. 490,975
15 Claims. (Cl. 73—170)

This invention relates to a device for electrically measuring solar radiation, and more particularly, to a self-contained weatherproof, indicating and integrating solar radiometer, of the type commonly called a pyranometer.

It is well known in the art that the short circuit current of a silicon photovoltaic cell, hereinafter referred to as a solar cell, can be utilized to measure the intensity of received solar radiation or sunshine due to the fact that the short circuit current is substantially a linear function of received solar radiation intensity. A solar radiation measuring device making use of this concept is described and claimed in U.S. Patent No. 3,145,568 granted to John I. Yellott, assignor to John Yellott Engineering Associates, Inc. Although there is a linear relationship between the short circuit current and received solar radiation, the short circuit current of the solar cell changes slightly with temperature variations and therefore, in order to obtain a true linear response, the temperature of the solar cell must remain constant. The aforementioned patent further teaches that the temperature sensitivity can be offset by coupling a resistor having a temperature characteristic (negative) opposite to the temperature characteristic of the solar cell (positive) in circuit combination with the solar cell, the two elements being in thermal contact with each other. Additionally, the resistor is of the order of a half an ohm or less to insure that the solar cell will operate under short circuit current conditions.

An object of the invention is to provide an improved solar radiation measuring device of the pyranometer type for measuring and integrating solar radiation.

Another object of the invention is to provide an instrument for integrating solar radiation requiring no external power supply.

Yet another object of the invention is to provide an integrating solar radiometer which is self-contained and housed in a weatherproofed enclosure.

Still another object of the invention is to provide a solar radiation measuring device utilizing the short circuit current from solar cells with the additional capability of integrating the amount of radiation received during any selected time period.

With these and other objects in view, which may be incident to my improvements, the invention consists in the parts and combinations to be hereinafter set forth and claimed, with the understanding that the several necessary elements, comprising my invention, may be varied in construction, proportions and arrangement, without departing from the spirit and scope of the appended claims.

In order to make my invention more clearly understood, I have shown in the accompanying drawings means for carrying the same into practical effect, without limiting the improvements in their useful applications to the particular constructions which, for the purpose of explanation, have been made the subject of illustration.

Briefly, the present invention utilizes a plurality of solar cells constructed and arranged to produce a short circuit current flow proportional to the intensity of the solar radiation falling on the cells, which current is measured by a milliammeter calibrated in terms of solar intensity. The current is then fed in series to an ampere-hour meter comprising a direct current permanent magnet motor, the rotative speed of which is directly proportional to the instantaneous value of the current, the total number of revolutions of the motor during any given period of time being proportional to the amount of radiation which has fallen on the solar cells during that same period of time. Additionally, a small resistance having a negative coefficient of resistance is placed in thermal contact with the solar cells and coupled thereto so as to provide a temperature compensated millivolt signal for use with an external recording or indicating millivolt-meter which can be coupled across the small resistance, thus providing additional flexibility. The instrument is adapted to be mounted in a weather-proof enclosure so that it can function in any type of weather conditions, and is particularly suitable for use in remote areas.

Figure 1:
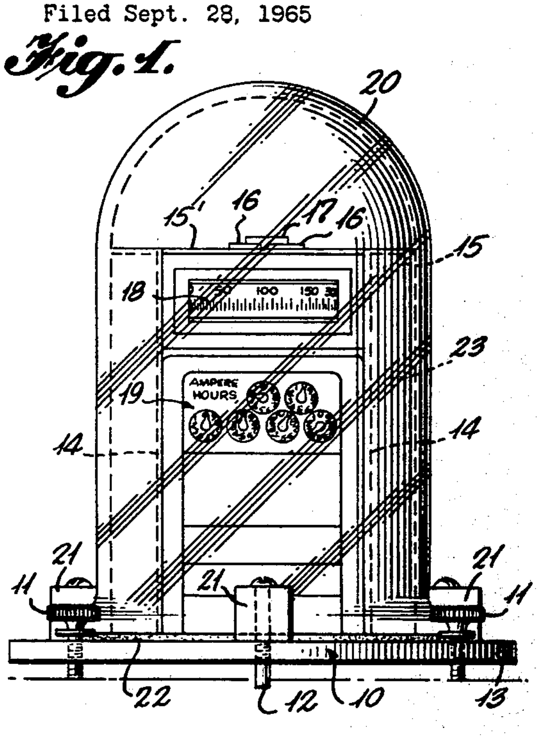
FIGURE 1 is a front elevational view of a first embodiment of the present invention, illustrating the arrangement of components.
Figure 2:
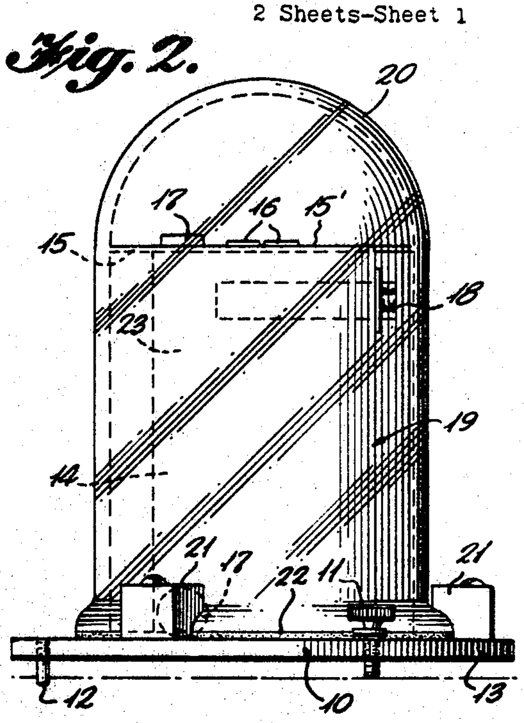
FIGURE 2 is a side elevational view of the embodiment shown in FIGURE 1.
Figure 3:
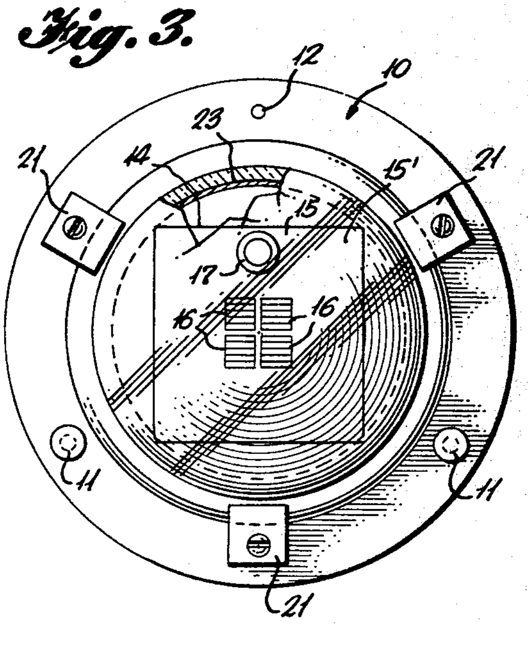
FIGURE 3 is a top plan view of the arrangement of components of the embodiment shown in FIGURE 1.

Referring to the drawings, and more particularly to FIGURES 1–3, the improved device for measuring solar radiation comprises a base 10, formed from aluminum or other suitable material, having a pair of leveling screws 11 and a front support pin 12 located in the peripheral rim portion 13 thereof. Mounted on the base 10 is a bracket member 14 adapted to support a solar cell mounting plate 15 having a plurality of solar cells 16 positioned thereon, said cells being either of the P-on-N or N-on-P silicon variety. A typical cell suitable for use with the device of the present invention is described in U.S. Patent No. 3,145,568, referred to hereinabove.

The solar cells 16 are adapted to be insulated from the mounting plate 15, and preferably include a resistive element, not shown, in thermal contact therewith for purposes of temperature compensation. The mounting plate 15 is horizontally disposed so that the cells 16 face upwardly towards the sky, adjustment of the plate being effected by the leveling screws 11. In the arrangement shown in FIGURE 3, four solar cells 16 are grouped as closely as possible together at the center of the mounting plate, and a circular spirit level 17 is mounted to one side of the solar cell arrangement, preferably the north side. That is to say, when the mounting plate 15 is positioned so that the cells receive solar radiation from the sky, the spirit level points to the north, since in this location it will not cast a shadow across the cells.

An edge-mounted milliammeter 18 is located within the side support bracket 14 beneath the cell mounting plate 15, said milliammeter being utilized to measure the short circuit current of the solar cells, as will be explained more fully hereinafter.

Beneath the milliammeter is an integrating ampere-hour meter 19 which is simply a permanent magnet direct current motor whose rotative speed is directly proportional to the current flowing therethrough. The number of rotations of the motor is counted by means of a suitable gear train and pointers or digital read-out means. The purpose of the ampere-hour meter 19 is to measure the total amount of solar radiation or sunshine which falls on the solar cells 16 during any given period of time.

The instrument is adapted to weather-proofed but still permits sunshine to fall upon the solar cells 16 and enables the user to read the scale of the milliammeter 18 and the ampere-hour meter 19. This is accomplished by enclosing the entire instrument within a transparent glass or plastic dome 20, commonly referred to as a bell jar. The dome or bell jar 20 is fastened to the base 10 by means of hold-down blocks 21 secured to the base 10 and extending over the peripheral bottom edge of the bell jar. A suitable gasket 22 is placed between the bell jar 20 and the base 10 to insure a weather seal. A suitable desiccator, not shown, may also be included to remove moisture from the air within the bell jar.

Figure 4:
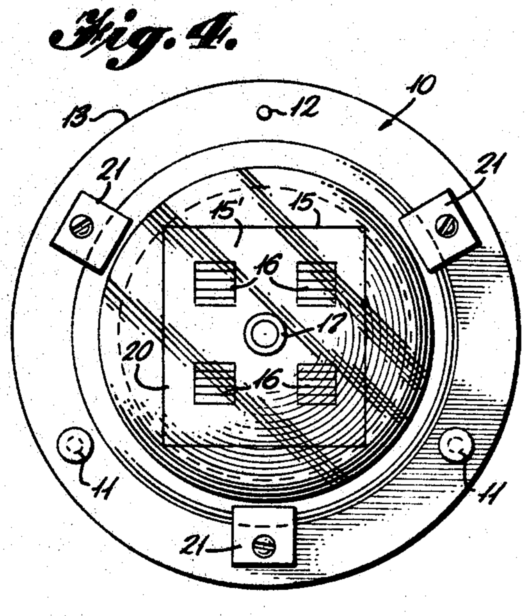
FIGURE 4 is a top plan view of a modified arrangement of the components of the present invention.

Before proceeding with a description of electrical connections of the various components shown in FIGURES 1 through 3, it is to be noted that a modification of the arrangement of the solar cells 16 can be employed without departing from the spirit and scope of the invention. This modified arrangement is shown in FIGURE 4, wherein the four cells 16 are mounted on the plate 15 in spaced relation in a substantially rectangular array, the spirit level 17 being positioned at the center of the rectangle, but submerged in the plate 15 so that it cannot cast a shadow upon the cells.

For optimum effectiveness, it is desirable that a portion of the inner wall of the glass bell jar 20 be fitted with a white jacket 23 or be painted with a material yielding a light reflective surface for reflecting unuseable radiation. It is also desirable that the upper portion of the cell mounting plate 15 surrounding and enclosing the excess area not taken up by the solar cells 16 be provided with a white reflective surface, designated generally by numeral 15'. The purpose of the above-described reflective surfaces is to reflect as much unused solar radiation as possible, thus keeping the internal temperature of the instrument relatively cool.

Figures 5, 6, 7, 8:
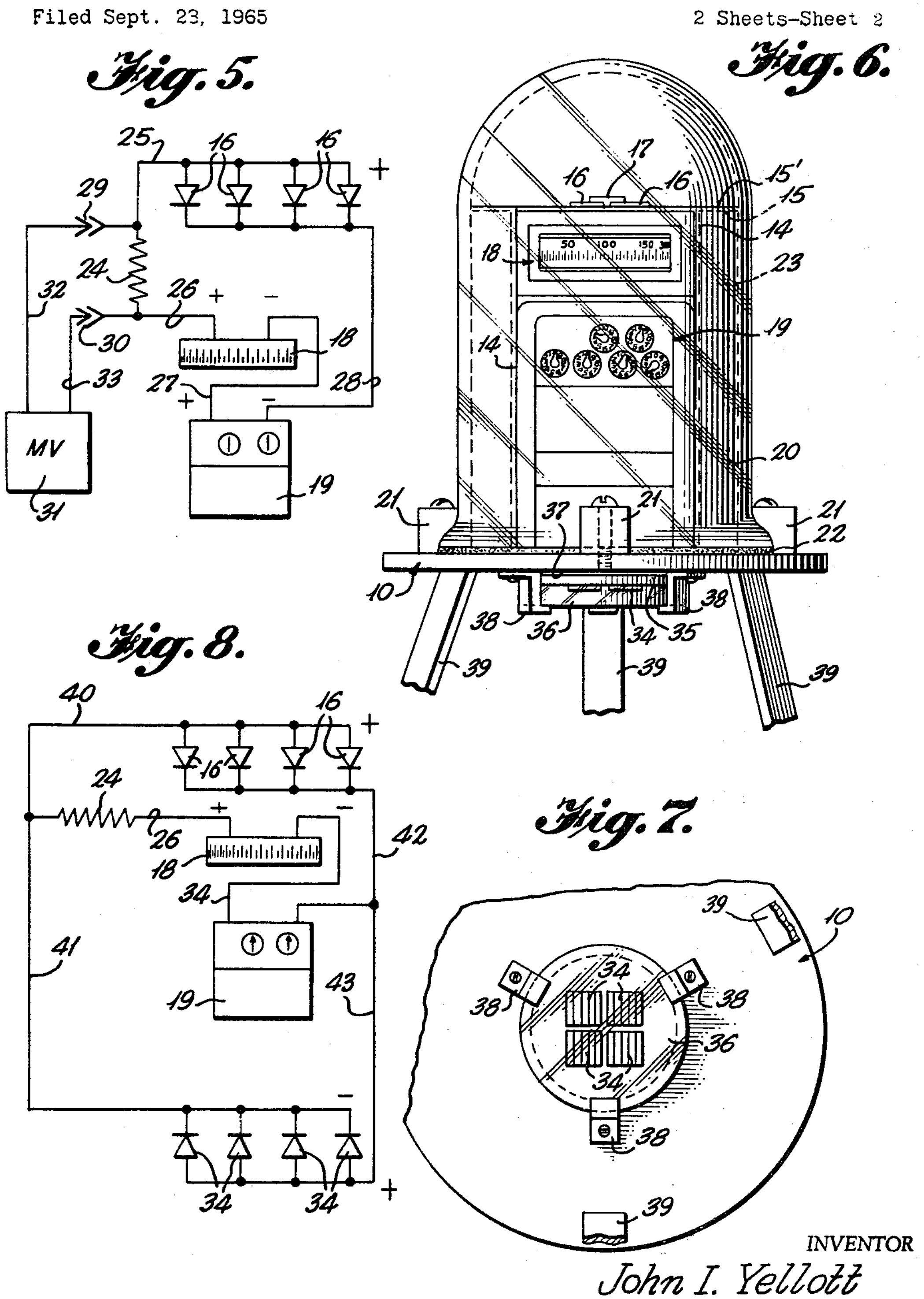
FIGURE 5 is a schematic diagram of the electrical circuit of the embodiment shown in FIGURE 1.
FIGURE 6 is a front elevational view of a second embodiment of the present invention.
FIGURE 7 is a bottom plan view of the embodiment shown in FIGURE 6.
FIGURE 8 is a schematic diagram of the electrical circuit of the embodiment of the invention shown in FIGURE 7.

Referring to FIGURE 5, the electrical schematic diagram of the first embodiment illustrated in FIGURES 1–3 of the drawings is shown therein. The solar cells 16 which are connected in parallel, are in turn, connected in series with a relatively small resistance 24, preferably of the order of .01–1.0 ohm, as well as with the milliammeter 18 and the ampere-hour meter 19. One end of resistance 24 is connected to the positive terminal of the solar cells 16 by means of a circuit lead 25, the opposite end thereof being coupled to the positive terminal of the milliammeter 18 by means or circuit lead 26. The negative terminal of milliammeter 18 is connected to the positive terminal of the ampere-hour meter 19 by means of a circuit lead 27, and finally, the series circuit is completed by connecting the negative terminal of the ampere-hour meter to the negative terminal of the solar cells 16 by means of a circuit lead 28. The low resistance 24 is adapted to be in thermal contact with the solar cells 16 and, moreover, preferably has a negative temperature characteristic. The value of the resistance 24 as well as the internal resistances of the milliammeter 18 and the ampere-hour meter 19 is small enough that the incident radiation falling on the solar cells 16 will produce a short circuit current proportional to the intensity of the sunshine falling thereon. The negative temperature characteristic of the resistance 24, moreover, will compensate for the small change in short circuit current due to temperature, in the manner taught by U.S. Patent No. 3,145,568, referred to hereinabove. The resistance 24 is provided with a pair of terminals 29 and 30, across which is connected a millivolt meter 31, through leads 32 and 33. The short circuit current of the solar cells 16 will produce a temperature compensated millivolt signal across the resistance 24, whereby the millivolt meter 31 is thus temperature compensated. By employing hte white reflective surface 15' and the white jacket 23, the temperature of the instrument is maintained relatively close to the ambient temperature. Experience shows that without the reflective surface and the jacket, the temperature of the instrument can rise as much as 50° F. above the ambient temperature. If desired, a recorder, not shown, can be coupled to the terminals 29 and 30 for obtaining a permanent record.

In operation, the solar cells 16 will produce a short circuit current which is directly proportional to the intensity of the solar radiation received. The milliammeter 18 being in series will give an instantaneous reading of the short circuit current which in turn can be calibrated in terms of solar intensity. Since the ampere-hour meter 19 is also connected in series with the solar cells 16, the short circuit current then drives the direct current permanent magnet motor incorporated therein. Since the rotative speed of the motor is directly proportional to the instantaneous value of the current, the total number of revolutions of the motor during any given period is proportional to the total amount of sunshine which has fallen on the solar cells during that same period of time. This, then, yields an integration of the total amount of sunshine which has fallen during any given period of time.

It is to be noted that no external power supply is required since the solar cells 16 provide all the power which is needed to operate both the milliammeter 18 and the integrating ampere-hour meter 19. Also, since the instrument is enclosed and sealed against the weather, it can be left unattended out-of-doors for extended periods of time, even in remote areas.

Referring to FIGURES 6 and 7, there is shown a second embodiment of the invention incorporating all of the features of the first embodiment illustrated in FIGURES 1–5, but differing therefrom in that a second set of solar cells 34 is provided, said cells being carried by a mounting plate 35 secured to the under surface of the base 10. The solar cells 34 are arranged in a rectangular array similar to the cells 16; however, they are directed downwardly, as shown. The cells 34 are enclosed by a cover glass 36, adapted to be hermetically sealed to the mounting plate 35 by means of a gasket 37 and hold-down blocks 38 secured to the under side of plate 10. A plurality of leg members 39 are provided whereby the instrument can be supported in desired position above the ground or other surface.

Referring to FIGURE 8, the electrical schematic diagram of the second embodiment of the invention includes solar cells 16 connected in parallel to the series combination of the resistance 24, the milliammeter 18, and the ampere-hour meter 19 in the same manner as described hereinabove in connection with the first embodiment. The second set of solar cells 34 is connected in parallel and across the cells 16 in circuit opposition thereto. The positive terminals of the cells 16 are connected to one side of the resistance 24 by means of a lead 40, while the negative terminals of the solar cells 34 are connected to the same side of the resistance 24 by means of a circuit lead 41. The negative terminals of the cells 16 are connected to one terminal of the ampere-hour meter 19, by means of circuit lead 42 and the positive terminals of the cells 34 are connected to the same terminal of the ampere-hour meter 14 by means of a circuit lead 43.

In operation, the solar cells 16 are adapted to measure the solar radiation in the same manner as described with respect to the first embodiment. That is, a short circuit current will flow which is directly proportional to the intensity of the incident radiation. The second set of cells 34 is directed downwardly toward the ground and will also produce a short circuit current to the solar radiation reflected therefrom due to the small value of the resistance 24 and the small internal resistances of the millivolt meter 18 and the ampere-hour meter 19. The short circuit currents from the cells 16 and 34, however, are opposed and accordingly the net current passing through the milliammeter 18 and the ampere-hour meter 19 is the difference between the two currents. Since the current from the solar cells 16 is proportional to the incident solar radiation, and the current from the solar cells 34 is pro- 8. A pyranometer for measuring solar radiation comprising in combination: a first plurality of photovoltaic cells; a first base member upon which said first plurality of photovoltaic cells are mounted; spirit level means fixedly attached to said first base member for providing a means for positioning said first base member along a horizontal plane; electrical circuit means for coupling said first plurality of photovoltaic cells in parallel; a second plurality of photovoltaic cells; a second base member upon which said second plurality of photovoltaic cells are mounted, said first base member and said second base member cooperating to point said first plurality of photovoltaic cells skyward while said second base member is adapted to point said second plurality of photovoltaic cells earthward; circuit means for coupling said second plurality of photovoltaic cells in parallel; circuit means for connecting said first plurality of photovoltaic cells across said second plurality of photovoltaic cells in circuit opposition such that the currents flowing therefrom are in opposing sense thereby providing a net current; and a series circuit coupled across said first and said second plurality of photovoltaic cells for measuring said net current, said series circuit comprising instantaneous current measuring means and a time integrating current measuring means for measuring the net current over a predetermined period of time.

9. Apparatus as set forth in claim 8, wherein pedestal means are provided for supporting said apparatus a predetermined distance above the ground or other surface so that reflected radiation therefrom may be readily directed to said second plurality of photovoltaic cells.

10. Apparatus as set forth in claim 8, wherein said series circuit includes a relatively small series resistor having a value sufficient to insure essentially short circuit current flow from said first and said second photovoltaic cells and being in thermal contact therewith, and having a temperature characteristic which is opposite in sense from said photovoltaic cells for providing a temperature-compensated millivolt signal which is proportional to said net current.

11. Apparatus as set forth in claim 10, wherein said series resistor has a value in the order of 0.1–1.0 ohm and a temperature characteristic opposite to said photovoltaic cells.

12. Apparatus as set forth in claim 8, wherein the apparatus is enclosed by a weather-proof housing.

13. Apparatus as set forth in claim 12, wherein said enclosure includes a transparent cover for allowing solar radiation to be directed to said first plurality of photovoltaic cells and for providing visual access to said instantaneous current measuring means and said time integrating current measuring means; and a transparent window covering said second plurality of photovoltaic cells for allowing said cells to receive reflected radiation from the earth.

14. Apparatus as set forth in claim 13, wherein said cover includes jacket means mounted on the inside wall thereof to reflect unwanted radiation from a selected area of the cover to thereby maintain the internal temperature of the instrument relatively cool.

15. A pyranometer for measuring solar radiation comprising in combination: an instrument base member; a plurality of photovoltaic semiconductor cells; a cell mounting base member adapted to be fixedly attached to said instrument base member and including means for mounting said plurality of photovoltaic semiconductor cells thereon but insulated therefrom; leveling means attached to said apparatus for positioning said plurality of photovoltaic semiconductor cells in a substantially horizontal position; electrical circuit means for coupling said plurality of photovoltaic semiconductor cells in parallel circuit combination; series circuit means connected to said photovoltaic semiconductor cells, said series circuit means comprising a milliammeter and an integrating ampere-hour meter coupled together for providing both instantaneous and an integrated measurement with respect to time of said short circuit current; and transparent enclosure means covering the combination of said photovoltaic semiconductor cells, the milliammeter and the integrating ampere-hour meter, said enclosure means being in engagement with said instrument base member and including means for sealing the enclosed members against the weather.

References Cited

UNITED STATES PATENTS

| | | | |
|---|---|---|---|
| 1,564,877 | 12/1925 | Marcellus | 324—151 X |
| 1,911,456 | 5/1933 | Lyon | 73—170 X |
| 2,225,353 | 12/1940 | Scheldorf | 88—23 |
| 2,768,527 | 10/1956 | Stern et al. | 173—170 |
| 3,117,447 | 1/1964 | Lang | 73—355 |
| 3,145,568 | 8/1964 | Yellott | 73—355 |
| 3,222,522 | 12/1965 | Birkbak | 73—355 |

RICHARD C. QUEISSER, *Primary Examiner.*

JAMES J. GILL, *Examiner*

JERRY W. MYRACLE, *Assistant Examiner.* portional to the solar radiation reflected from the earth, the net current is a measure of the amount of solar radiation retained by the earth.

It will be appreciated that the improved solar radiation measuring instrument of the present invention requires no external power; it not only measures the instantaneous intensity of the solar rediation falling thereon but also includes integrating means whereby the amount of radiation during a specific period of time can be measured. The instrument also includes a small resistance with negative temperature characteristic, in thermal contact with the solar cells, so that a temperature-compensated millivolt signal can be generated and recorded or indicated by an external meter, in cases where higher precision and a graphical record are desired. As a further refinement, as noted hereinabove, a suitable desiccator may be enclosed within the glass dome or cover.

While the pyranometer of the present invention has been described as employing the low resistance 24 and millivolt circuit including meter 31, it should be pointed out that these elements may be omitted, if desired, without affecting the normal operation of the instrument.

While I have shown and described preferred embodiments of my invention, I wish it to be understood that I do not confine myself to the precise details of construction herein set forth by way of illustration, as it is apparent that many changes and variations may be made therein, by those skilled in the art, without departing from the spirit of the invention or exceeding the scope of the appended claims.

I claim as my invention:

1. A solar radiation measuring device comprising in combination: photovoltaic semiconductor cell means adapted to receive solar radiation; a series circuit connected to said semiconductor cell means having a resistance of sufficiently low value to cause said semiconductor cell means to produce a short circuit current proportional to the intensity of the solar radiation received, said series circuit including meter means for measuring the instantaneous short circuit current and DC motor means connected in series combination with said meter means and having a rotor whose rotative speed is directly proportional to the instantaneous value of said short circuit current, with the total number of revolutions during any given period of time thus being proportional to the amount of solar radiation which has fallen on said semiconductor cell means during said given period of time; and indicator means coupled to said DC motor means for providing a read-out of said total number of revolutions.

2. A solar radiation measuring device comprising in combination: a plurality of solar cells connected in parallel and adapted to receive solar radiation and produce a short circuit current proportional thereto; a series circuit comprising a milliammeter and an integrating ampere-hour meter coupled to said plurality of solar cells, said ampere-hour meter including a permanent magnet DC motor having a rotative speed which is directly proportional to the instantaneous value of current flowing therein; the milliammeter providing a visual indication of the instantaneous value of said short circuit current and the integrating ampere-hour meter providing an indication of the amount of radiation which has fallen on said plurality of solar cells during any given period of time.

3. A pyranometer comprising in combination: a plurality of silicon photovoltaic semiconductor cells adapted to be responsive to solar radiation; resistance means coupled in circuit combination with said plurality of silicon photovoltaic semiconductor cells and having a relatively small resistance to insure essentially short circuit current flow from said semiconductor cells when solar radiation is directed thereto, said resistance means additionally being in thermal contact with said plurality of semiconductor cells for providing a temperature-compensated millivolt signal; current measuring means coupled in series to both said plurality of photovoltaic semiconductor cells and said resistance means for measuring said short circuit current; DC motor means connected in series to said plurality of photovoltaic cells, said resistance means and said current measuring means thereby providing a closed circuit path, said DC motor means having a rotative speed which is directly proportional to the instantaneous value of said short circuit current, and including means for counting the total number of revolutions of said DC motor means during any given period of time thus providing an indication of the total amount of solar radiation which has fallen on said plurality of silicon photovoltaic semiconductor cells during said given period of time; and a weather-proof housing enclosing said aforementioned apparatus.

4. A pyranometer according to claim 3 and wherein said housing comprises a transparent cover whereby to permit the incoming solar radiation to irradiate the photovoltaic semiconductor cells to enable the readings of the current measuring means and the means for counting said total number of revolutions to be viewed.

5. A pyranometer comprising in combination: a plurality of silicon photovoltaic semiconductor cells adapted to be responsive to solar radiation; resistance means coupled in circuit combination with said plurality of silicon photovoltaic semiconductor cells and having a relatively small resistance to insure essentially short circuit current flow from said semiconductor cells when solar radiation is directed thereto, said resistance means additionally being in thermal contact with said plurality of semiconductor cells for providing a temperature-compensated millivolt signal; current measuring means coupled in series to both said plurality of photovoltaic semiconductor cells and said resistance means for measuring said short circuit current; an ampere-hour meter connected in series to said plurality of photovoltaic cells, said resistance means and said current measuring means thereby providing a closed circuit path, said ampere-hour meter having a DC motor whose rotative speed is directly proportional to the instantaneous value of said short circuit current, and including means for counting the total number of revolutions of said DC motor means during any given period of time thus providing an indication of the total amount of solar radiation which has fallen on said plurality of silicon photovoltaic semiconductor cells during said given period of time; and a weather-proof housing enclosing said aforementioned apparatus.

6. A solar radiation measuring device comprising in combination: a first plurality of semiconductor photovoltaic cells connected in parallel and adapted to be directed skyward to receive solar radiation from the sun; a second plurality of semiconductor photovoltaic cells connected in parallel and adapted to be directed towards the earth for receiving solar radiation reflected therefrom; circuit means for coupling said first plurality of photovoltaic cells across said second plurality of photovoltaic cells in circuit opposition such that a net current results and a series circuit coupled across said first and said second plurality of photovoltaic cells, said series circuit comprising current measuring means for indicating the instantaneous net current from said first and said second plurality of photovoltaic cells and a time integrating current measuring means connected to said current measuring means for integrating the net current from said first and said second plurality of photovoltaic cells for a predetermined period of time.

7. Apparatus as set forth in claim 6, wherein said integrating current measuring means comprises an integrating ampere-hour meter having a permanent magnet direct current motor whose rotative speed is directly proportional to the instantaneous value of said short circuit current and including means for counting the total number of revolutions of said direct current motor during said predetermined period of time.